(12) United States Patent
Fukaya et al.

(10) Patent No.: US 9,952,501 B2
(45) Date of Patent: Apr. 24, 2018

(54) PHOTOMASK BLANK, MAKING METHOD, AND PHOTOMASK

(71) Applicant: SHIN-ETSU CHEMICAL CO., LTD., Tokyo (JP)

(72) Inventors: Souichi Fukaya, Joetsu (JP); Shinichi Igarashi, Joetsu (JP); Takashi Yoshii, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 113 days.

(21) Appl. No.: 15/255,529

(22) Filed: Sep. 2, 2016

(65) Prior Publication Data

US 2017/0082917 A1 Mar. 23, 2017

(30) Foreign Application Priority Data

Sep. 18, 2015 (JP) ................. 2015-184560

(51) Int. Cl.
| | | |
|---|---|---|
| *G03F 1/38* | (2012.01) | |
| *G03F 1/46* | (2012.01) | |
| *G03F 1/50* | (2012.01) | |
| *G03F 1/80* | (2012.01) | |

(52) U.S. Cl.
CPC ............ *G03F 1/38* (2013.01); *G03F 1/46* (2013.01); *G03F 1/50* (2013.01); *G03F 1/80* (2013.01)

(58) Field of Classification Search
CPC ..... G03F 1/38; G03F 1/46; G03F 1/50; G03F 1/80

USPC .............................................................. 430/5
See application file for complete search history.

(56) References Cited

U.S. PATENT DOCUMENTS

| | | |
|---|---|---|
| 5,474,864 A | 12/1995 | Isao et al. |
| 6,599,667 B2 | 7/2003 | Yusa et al. |
| 7,767,366 B2 | 8/2010 | Yoshikawa et al. |

FOREIGN PATENT DOCUMENTS

| | | |
|---|---|---|
| JP | 63-85553 A | 4/1988 |
| JP | 1-142637 A | 6/1989 |
| JP | 3-116147 A | 5/1991 |
| JP | 4-246649 A | 9/1992 |
| JP | 7-140635 A | 6/1995 |
| JP | 2001-312043 A | 11/2001 |
| JP | 3093632 U | 5/2003 |
| JP | 2003-195479 A | 7/2003 |
| JP | 2003-195483 A | 7/2003 |
| JP | 2007-241065 A | 9/2007 |

*Primary Examiner* — Christopher G Young (74) *Attorney, Agent, or Firm* — Birch, Stewart, Kolasch & Birch, LLP (57) ABSTRACT

A photomask blank comprising a transparent substrate (1), an etching stop film (2), a light-shielding film (3), and an etching mask film (4) has on the substrate side a reflectance of up to 35% with respect to exposure light. The etching stop film (2) consists of a first layer (21) which is disposed contiguous to the substrate and functions as an antireflective layer and a second layer (22) functioning as a fluorine-base dry etching-resistant layer, one of the first and second layers is a layer having compressive stress and the other is a layer having tensile stress.

14 Claims, 3 Drawing Sheets

PHOTOMASK BLANK, MAKING METHOD, AND PHOTOMASK

CROSS-REFERENCE TO RELATED APPLICATION

This non-provisional application claims priority under 35 U.S.C. § 119(a) on Patent Application No. 2015-184560 filed in Japan on Sep. 18, 2015, the entire contents of which are hereby incorporated by reference.

TECHNICAL FIELD

This invention relates to photomask blanks and photomasks for use in the microfabrication of semiconductor integrated circuits, charge coupled devices (CCD), liquid crystal display (LCD) color filters, magnetic heads or the like.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shielding film pattern. In an attempt to miniaturize the light-shielding film pattern, if processing is carried out while maintaining the thickness of the resist film at the same level as prior to the miniaturization, the ratio of film thickness to feature width, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film which is etched using the resist pattern as an etch mask, on the other hand, a number of light-shielding film materials have been proposed. In practice, chromium compound films are always employed because there are known a number of findings with respect to their etching and the standard process has been established. Typical of such films are light-shielding films composed of chromium compounds necessary for photomask blanks for ArF excimer laser lithography, which include chromium compound films with a thickness of 50 to 77 nm as described in Patent Documents 1 to 3.

However, oxygen-containing chlorine-base dry etching which is a common dry etching process for chromium based films such as chromium compound films often has a capability of etching organic films to some extent. If etching is carried out through a thin resist film, accurate transfer of the resist pattern is difficult. It is a task of some difficulty for the resist to have both a high resolution and etch resistance that allows for high accuracy etching. Then, for the purpose of achieving high resolution and high accuracy, the light-shielding film material must be reviewed so as to find a transition from the approach relying only on the resist performance to the approach of improving the light-shielding film performance as well.

Also, as to light-shielding film materials other than the chromium based materials, a number of studies have been made. One example of these studies is the use of tantalum in the light-shielding film for ArF excimer laser lithography, as described in Patent Document 4.

On the other hand, it has long been a common practice to use a hard mask for reducing the load on resist during dry etching. For example, Patent Document 5 discloses $MoSi_2$ overlaid with a $SiO_2$ film, which is used as an etch mask during dry etching of $MoSi_2$ with chlorine-containing gas. It is described that the $SiO_2$ film can also function as an antireflective coating.

From the past, studies have been made on metal silicide films, especially molybdenum silicide films, which can be readily etched under etching conditions for fluorine-base dry etching that causes few damages to resist film. They are disclosed, for example, in Patent Documents 5 to 7, all of which basically use a film of silicon and molybdenum=2:1. Also, Patent Document 8 discloses a metal silicide film, which has never been applied to commercial fabrication because of practical problems. In the commercial fabrication process, commonly used chromium-base light-shielding films are improved to accommodate further miniaturization.

Photomasks relying on the super-resolution technology include halftone and Levenson phase shift photomasks. When a photomask blank is processed into a photomask, a portion of light-shielding film causing a phase shift to light is removed. In this step, selective etching between the underlying film or substrate and the light-shielding film is necessary. Since commonly used chromium-base materials are superior in this sense, few studies have been made on the application of other materials.

CITATION LIST

Patent Document 1: JP-A 2003-195479
Patent Document 2: JP-A 2003-195483
Patent Document 3: JP-U 3093632
Patent Document 4: JP-A 2001-312043
Patent Document 5: JP-A S63-85553
Patent Document 6: JP-A H01-142637
Patent Document 7: JP-A H03-116147
Patent Document 8: JP-A H04-246649
Patent Document 9: JP-A 2007-241065
Patent Document 10: JP-A H07-140635

DISCLOSURE OF INVENTION

As the method for forming a photomask pattern of finer size, Patent Document 9 describes that a light-shielding film is composed of a single layer formed of a material containing a transition metal and silicon or multiple layers including at least one layer formed of a material containing a transition metal and silicon. This film exhibits sufficient light-shielding properties, and allows the optical proximity effect (or line density dependence) during etching to be reduced, enabling precise processing.

One exemplary photomask blank of such film construction is a photomask blank comprising a transparent substrate, an etching stop film disposed directly thereon which is resistant to fluorine-base dry etching and removable by chlorine-base dry etching, a light-shielding film disposed on the substrate through the etching stop film and composed of a single layer of a material containing silicon and a transition metal or multiple layers including at least one layer of a material containing silicon and a transition metal, and a film of mono or multi-layer structure disposed on the light-shielding film. In this construction, the etching stop film may be a film of mono or multi-layer structure and formed of chromium alone or a chromium compound containing chromium and at least one element selected from oxygen, nitrogen and carbon. When the photomask blank is processed into a photomask, the etching stop film is left (not removed). Upon exposure through the photomask, the influence of the remaining etching stop film must be taken into account. In the exposure step through the photomask wherein exposure light is irradiated from the transparent substrate side, if the photomask on the substrate side has a high reflectance, the exposure light is reflected thereby. The reflected light may enter the photomask again due to diffuse reflection or the like, inhibiting the desired exposure.

When microelectronic devices of multilayer structure are fabricated through plural exposure steps using plural photomasks, a high overlay accuracy is necessary. As pattern features are miniaturized, the necessary overlay accuracy becomes higher. If stress is introduced in the etching stop film, the stress in the etching stop film is partially relieved during the pattern forming process involving the steps of resist coating, exposure, development, etching and resist stripping. The partial relief of film stress causes strain to the final photomask pattern. If the photomask is strained, the alignment accuracy of the photomask pattern is reduced.

In connection with the photolithography involving exposure to light of sub-200 nm wavelength, typically ArF excimer laser through a photomask, which requires satisfactory pattern transfer from the photomask to an object to be transcribed such as wafer and formation of a finer photomask pattern, an object of the invention is to provide a photomask blank which satisfies both high resolution and a high accuracy of etching when the photomask blank is processed into the photomask, and more specifically, a photomask blank which is low in the optical proximity effect of a photomask pattern during etching and ensures a sufficient accuracy of processing; a method for preparing the blank; and a photomask having a mask pattern of the film on the photomask blank.

Regarding a photomask blank comprising an etching stop film, a light-shielding film, and an etching mask film on a transparent substrate, the inventors have found that better results are obtained when the etching stop film is a film of multilayer structure including a first layer disposed contiguous to the substrate and functioning as an antireflective layer on the substrate side and a second layer functioning as a fluorine-base dry etching-resistant layer, wherein one of the first and second layers is a layer having compressive stress induced therein and the other is a layer having tensile stress induced therein. The reflectance on the substrate side at the exposure wavelength is reduced. The pattern transfer performance upon exposure through the photomask is satisfactory. The warpage caused by the etching stop film is minimized. The relief of stress in the etching stop film during formation of a mask pattern of the photomask is reduced. Thus, the strain in the photomask pattern is minimized.

In one aspect, the invention provides a photomask blank from which is produced a photomask comprising a transparent substrate and a mask pattern formed thereon including transparent regions and effectively opaque regions to exposure light, the photomask blank comprising an etching stop film disposed contiguous to the substrate and consisting of multiple layers formed of a material which is resistant to fluorine-base dry etching and removable by oxygen-containing chlorine-base dry etching, a light-shielding film which is disposed contiguous to the etching stop film and consists of a single layer of a silicon-containing material or multiple layers including at least one layer of a silicon-containing material, the silicon-containing material being resistant to oxygen-containing chlorine-base dry etching and removable by fluorine-base dry etching, and an etching mask film disposed on the light-shielding film and formed of a material which is resistant to fluorine-base dry etching and removable by oxygen-containing chlorine-base dry etching. The photomask blank on the substrate side has a reflectance of up to 35% with respect to the exposure light. The etching stop film includes a first layer which is disposed contiguous to the substrate and functions as an antireflective layer on the substrate side and a second layer functioning as a layer highly resistant to fluorine-base dry etching, one of the first and second layers is a layer having compressive stress induced therein and the other is a layer having tensile stress induced therein.

In a preferred embodiment, the reflectance is up to 30%.

In a preferred embodiment, each of the layers of the etching stop film is formed of chromium alone, a chromium compound containing chromium and at least one element selected from oxygen, nitrogen and carbon, tantalum alone, or a tantalum compound containing tantalum and being free of silicon.

In another preferred embodiment, each of the layers of the etching stop film is formed of chromium alone or a chromium compound containing chromium and at least one element selected from oxygen, nitrogen and carbon, and at least one of the layers has a chromium content of less than 50 at %.

In a preferred embodiment, the etching stop film has a thickness of 2 to 20 nm. Typically, the etching stop film is disposed on the substrate to cause a warpage of up to 50 nm, more specifically up to 30 nm.

In a preferred embodiment, the etching mask film is formed of chromium alone or a chromium compound containing chromium and at least one element selected from oxygen, nitrogen and carbon.

Typically, the photomask is used to transfer a fine line pattern with a line width of up to 20 nm to an object to be transcribed.

The photomask blank may further comprise an antireflective film of mono or multi-layer structure between the light-shielding film and the etching mask film, the antireflective film functioning as an antireflective layer on the side remote from the substrate.

Preferably the antireflective film includes a layer of a transition metal/silicon compound containing a transition metal, silicon, and one or both of oxygen and nitrogen. Also preferably the antireflective film includes a layer of chromium alone or a chromium compound containing chromium and one or both of oxygen and nitrogen.

In another aspect, the invention provides a method for preparing the photomask blank defined above, comprising the steps of forming the etching stop film on the transparent substrate, forming the light-shielding film contiguous to the etching stop film, heat treating the etching stop film and the light-shielding film at 260 to 500° C. for at least 4 hours, and thereafter, forming the etching mask film on the light-shielding film.

In a further aspect, the invention provides a photomask comprising a transparent substrate and a mask pattern formed thereon including transparent regions and effectively opaque regions to exposure light, the mask pattern comprising an etching stop film of multiple layers formed of a material which is resistant to fluorine-base dry etching and removable by oxygen-containing chlorine-base dry etching, and a light-shielding film which is disposed contiguous to the etching stop film and consists of a single layer of a silicon-containing material or multiple layers including at least one layer of a silicon-containing material, the silicon-containing material being resistant to oxygen-containing chlorine-base dry etching and removable by fluorine-base dry etching. The photomask on the substrate side has a reflectance of up to 35% with respect to the exposure light. The etching stop film includes a first layer which is disposed contiguous to the substrate and functions as an antireflective layer on the substrate side and a second layer functioning as a layer highly resistant to fluorine-base dry etching, one of the first and second layers is a layer having compressive stress induced therein and the other is a layer having tensile stress induced therein.

ADVANTAGEOUS EFFECTS OF INVENTION

The photomask blank of the invention having an etching stop film having low film stress is processed into a photomask. Upon exposure through the photomask, satisfactory transfer performance is obtained while reflection on the substrate side is restrained. After a mask pattern of the photomask is formed, the relief of stress in the etching stop film is minimized. The photomask pattern can be formed at a high accuracy. The photomask obtained by processing the photomask blank is improved in reliability on its use in sub-20 nm node lithography.

DESCRIPTION OF PREFERRED EMBODIMENTS

The photomask blank of the invention is defined as comprising a transparent substrate, typically quartz substrate, an etching stop film disposed contiguous thereto, a light-shielding film disposed contiguous to the etching stop film, and an etching mask film disposed on the light-shielding film directly or through another film. The photomask blank is processed into a photomask comprising a transparent substrate and a mask pattern formed thereon including transparent regions and effectively opaque regions to exposure light, typically light of wavelength up to 200 nm. The photomask is suited for transferring a fine-line pattern with a line width of up to 20 nm to an object to be transcribed (a recipient or processable substrate). The photomask blank is advantageously processed into a photomask for use in photolithography using ArF excimer laser light (wavelength 193 nm) as the exposure light. As the transparent substrate, quartz substrates of 152 mm (6 inches) squares and 6.35 mm (¼ inch) thick, known as 6025 substrates are preferred.

The photomask blank is converted to a photomask by forming a mask pattern thereon. When a photomask is produced from the photomask blank having an etching stop film, the photomask has the etching stop film left thereon (i.e., not removed). Upon exposure through the photomask, exposure light is irradiated from the transparent substrate side. If the photomask on the substrate side has a high reflectance, the exposure light is reflected thereby and some of the reflected light may enter the photomask again due to diffuse reflection or the like, inhibiting the desired exposure. To overcome the problem, the photomask blank of the invention has an etching stop film which is constructed as a multilayer structure including a first layer disposed contiguous to the substrate and functioning as an antireflective layer on the substrate side and a second layer functioning as a layer highly resistant to fluorine-base dry etching, and the photomask blank on its substrate side has a reflectance of up to 35%, preferably up to 30% at the exposure wavelength. Now that the etching stop film is constructed as above, the reflectance on the substrate side at the exposure wavelength is reduced. Upon exposure through the photomask, the desired pattern can be transferred at a high fidelity.

If stress has been introduced in the etching stop film, the stress in the etching stop film is partially relieved during pattern formation on the photomask blank. This causes strain to the final photomask pattern. The alignment accuracy of the photomask pattern is reduced. According to the invention, one of the first and second layers constituting the etching stop film is a layer having compressive stress and the other is a layer having tensile stress. By constructing the etching stop film as a combination of compression stressed layer and tension stressed layer, the stresses are offset and therefore, the warpage caused by the etching stop film may be reduced. Specifically, the warpage caused by the etching stop film on the transparent substrate may be reduced to 50 nm or less, especially 30 nm or less.

When the etching stop film is constructed by two layers, the layer disposed contiguous to the substrate may be the first layer and the layer disposed remote from the substrate be the second layer. When the etching stop film is constructed by three or more layers, the layer disposed contiguous to the substrate may be the first layer and two or more layers disposed remote from the substrate may be identical or different in composition and be the second layer.

Each of the layers constituting the etching stop film is formed of a material which is resistant to fluorine-base dry etching and removable by oxygen-containing chlorine-base dry etching. Suitable materials include chromium alone, chromium compounds containing chromium and at least one element selected from oxygen, nitrogen and carbon, tantalum alone, and tantalum compounds containing tantalum and being free of silicon. Especially, chromium alone and chromium compounds containing chromium and at least one element selected from oxygen, nitrogen and carbon are preferable. At least one of the layers constituting the etching stop film, especially the first layer should preferably have a chromium content of less than 50 at %, more preferably up to 40 at %.

The first layer is preferably formed of a chromium compound, with chromium compounds containing oxygen such as CrO and CrON, especially chromium compounds containing oxygen and nitrogen such as CrON being desirable. The second layer may be formed of chromium alone or a chromium compound, with chromium compounds containing nitrogen such as CrN and CrON, especially chromium compounds containing nitrogen and being free of oxygen such as CrN being desirable.

In an embodiment wherein the first layer functioning as antireflective layer is a compression stressed layer and the second layer functioning as highly resistant layer to fluorine-base dry etching is a tension stressed layer, the first layer having compressive stress preferably contains oxygen, and is more preferably formed of CrON containing 25 to 45 at % of chromium, 45 to 65 at % of oxygen and 5 to 15 at % of nitrogen. On the other hand, the second layer having tensile stress is preferably free of oxygen, and is more preferably formed of CrN containing at least 60 at %, especially at least 70 at % and up to 95 at % of chromium, and at least 5 at % and up to 35 at %, especially up to 25 at % of nitrogen.

The etching stop film preferably has a thickness of at least 2 nm, more preferably at least 3 nm and up to 20 nm, more preferably up to 12 nm. Among the layers, the first layer preferably has a thickness of at least 1 nm, and up to 10 nm, more preferably up to 6 nm, and the second layer preferably has a thickness (when the second layer is composed of two or more sub-layers, total thickness) of at least 1 nm, and up to 10 nm, more preferably up to 6 nm.

The light-shielding film consists of a single layer of a silicon-containing material or multiple layers including at least one layer of a silicon-containing material, the silicon-containing material being resistant to oxygen-containing chlorine-base dry etching and removable by fluorine-base dry etching. Suitable materials include silicon alone, transition metal alone, transition metal-silicon, silicon compounds containing silicon and at least one element selected from oxygen, nitrogen and carbon, and transition metal-silicon compounds containing a transition metal, silicon and at least one element selected from oxygen, nitrogen and carbon. Of the transition metals, molybdenum is most preferred. The contents of elements in the light-shielding film are adjusted so as to provide the desired light-shielding properties with respect to the exposure light. The light-shielding film preferably has a thickness of at least 37 nm, especially at least 40 nm and up to 66 nm, especially up to 63 nm.

The etching mask film is formed of a material which is resistant to fluorine-base dry etching and removable by oxygen-containing chlorine-base dry etching. Suitable materials include chromium alone and chromium compounds containing chromium and at least one element selected from oxygen, nitrogen and carbon. The etching mask film may be of mono- or multi-layer structure. The contents of elements in the etching mask film are adjusted so as to provide the desired etching properties and optionally the desired optical properties. The etching mask film preferably has a thickness of at least 5 nm, especially at least 8 nm and up to 22 nm, especially up to 15 nm.

Figure 1:
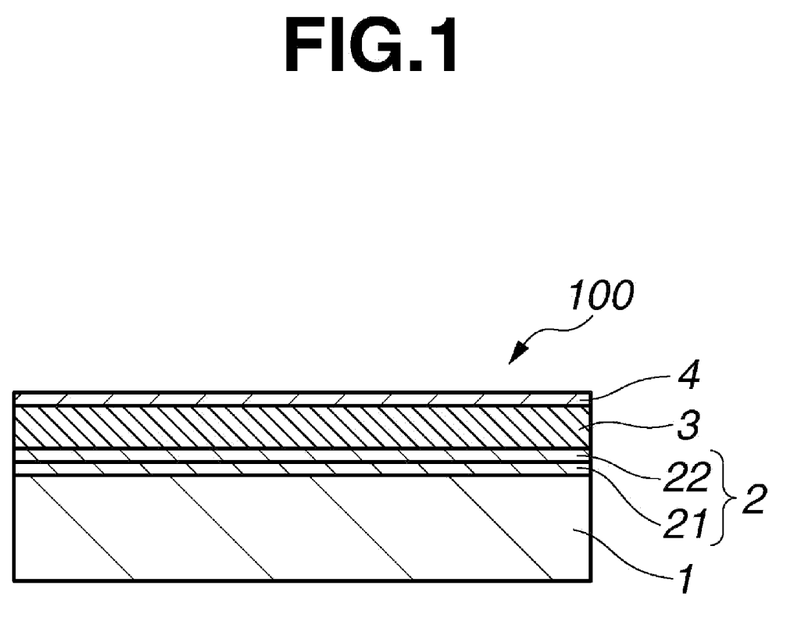
FIG. 1 is a cross-sectional view of a photomask blank in one embodiment of the invention.
Figure 2A:
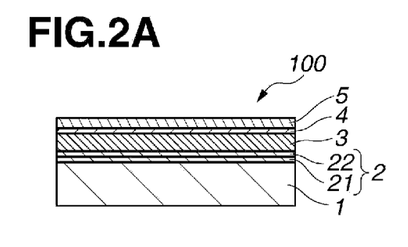
FIGS. 2A to 2E are set of cross-sectional views showing a series of steps for the manufacture of a photomask from an inventive photomask blank.
Figure 2B:
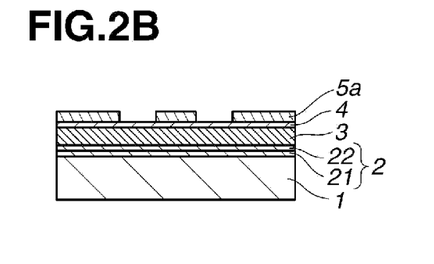
Figure 2C:
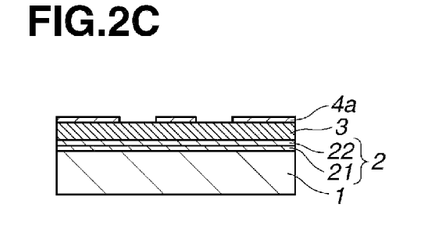
Figure 2D:
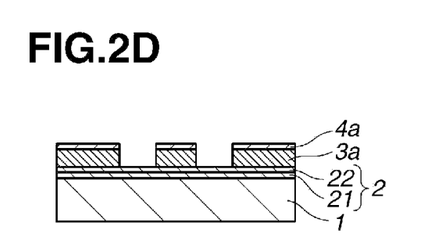
Figure 2E:
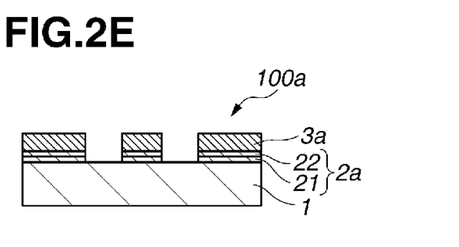

While the photomask blank comprises an etching stop film, light-shielding film and etching mask film as mentioned above, one exemplary photomask blank is shown in FIG. 1. FIG. 1 illustrates in cross section one exemplary photomask blank. The photomask blank 100 includes a transparent substrate 1, and an etching stop film 2 consisting of two layers, first and second layers 21 and 22, a light-shielding film 3, and an etching mask film 4 stacked in order from the substrate side.

An antireflective film of mono or multi-layer structure functioning as antireflective layer on the side remote from the substrate may be disposed between the light-shielding film and the etching mask film. The antireflective film may include a layer formed of a transition metal-silicon compound containing a transition metal, silicon and one or both of oxygen and nitrogen. In this embodiment, the antireflective film is resistant to oxygen-containing chlorine-base dry etching and removable by fluorine-base dry etching, like the light-shielding film, so that it may be etched in the same etching step as is the light-shielding film. Alternatively, the antireflective film may include a layer formed of chromium alone or a chromium compound containing chromium and one or both of oxygen and nitrogen. In this embodiment, the antireflective film is resistant to fluorine-base dry etching and removable by oxygen-containing chlorine-base dry etching, like the etching stop film and etching mask film, so that it may be etched in the same etching step as is the etching stop film or etching mask film. The contents of elements in the antireflective film are adjusted so as to provide the desired optical properties. The antireflective film preferably has a thickness of at least 5 nm, especially at least 10 nm and up to 30 nm, especially up to 25 nm.

The photomask blank of the invention may be prepared by forming an etching stop film on a transparent substrate, forming a light-shielding film contiguous to the etching stop film, and forming an etching mask film on the light-shielding film. In an embodiment wherein an antireflective film is included, the antireflective film may be formed on the light-shielding film before the etching mask film is formed on the antireflective film.

In the practice of the invention, the films and film-constituting layers may be formed by sputtering. The sputtering may be either DC or RF sputtering and performed by any well-known methods as described, for example, in Patent Document 10.

Of various sputtering modes, reactive sputtering is preferred when a film of a compound containing at least one element selected from oxygen, nitrogen and carbon is formed. Typically, inert gases and reactive gases are used as the sputtering gas. For example, the sputtering gas is adjusted by combining an inert gas such as argon gas (Ar), helium gas (He) or neon gas (Ne) with a reactive gas as nitrogen gas ($N_2$), nitrogen oxide gas ($N_2O$, $NO_2$), oxygen gas ($O_2$), and carbon oxide gas (CO, $CO_2$) so as to deposit the desired composition. A multilayer film may be obtained by changing the deposition composition stepwise or continuously, for example, by changing the composition of the sputtering gas stepwise or continuously.

The gas pressure during sputtering may be selected appropriate in consideration of such factors as film stress, chemical resistance, and cleaning resistance, and is typically in a range of 0.01 to 1 Pa, preferably 0.03 to 0.3 Pa, within which chemical resistance is improved. The flow rates of gases may be selected appropriate so as to deposit the desired composition, and are typically in a range of 0.1 to 100 sccm. The ratio of flow rate of reactive gas to inert gas is preferably at least 0, and more preferably up to 5.0. The power applied to the sputtering target may be selected appropriate in consideration of target size, cooling efficiency and ease of deposition control, and is typically in a range of 0.1 to 10 W/cm$^2$ as watt per unit area of the target surface to be sputtered.

When the etching stop film is formed of a chromium or tantalum compound, reactive sputtering may be carried out as follows. The target is selected in accordance with the composition of a film to be deposited from a chromium target, a target containing chromium and at least one element selected from oxygen, nitrogen and carbon, a tantalum target, and a target containing tantalum and at least one element selected from oxygen, nitrogen and carbon. The sputtering gas is adjusted in accordance with the composition of a film to be deposited by adding a reactive gas such as oxygen-containing gas, nitrogen-containing gas or carbon-containing gas to a rare gas such as Ar, He or Ne.

When the light-shielding film is formed of a silicon compound or transition metal-silicon compound or the antireflective film is formed of a transition metal-silicon compound, reactive sputtering may be carried out as follows. The target is selected in accordance with the composition of a film to be deposited from a silicon target, a silicon nitride target, a target containing silicon and silicon nitride, a transition metal target (e.g., molybdenum target), and a target containing a transition metal (e.g., molybdenum silicide target). The sputtering gas is adjusted in accordance with the composition of a film to be deposited by adding a reactive gas such as oxygen-containing gas, nitrogen-containing gas or carbon-containing gas to a rare gas such as Ar, He or Ne.

When the etching mask film is formed of a chromium compound or the antireflective film is formed of a chromium compound, reactive sputtering may be carried out as follows. The target is selected in accordance with the composition of a film to be deposited from a chromium target and a target containing chromium and at least one element of oxygen, nitrogen and carbon. The sputtering gas is adjusted in accordance with the composition of a film to be deposited by adding a reactive gas such as oxygen-containing gas, nitrogen-containing gas or carbon-containing gas to a rare gas such as Ar, He or Ne.

In a preferred embodiment of the photomask blank preparing method, at the stage when the etching stop film and light-shielding film have been formed, or at the stage when the etching stop film, light-shielding film and antireflective film have been formed if the antireflective film is included, the etching stop film, light-shielding film and optional antireflective film are heat treated at a temperature of at least 260° C. and up to 500° C., especially up to 400° C. for at least 4 hours, and after the heat treatment, the etching mask film is formed. By carrying out heat treatment, the stresses in the films of the photomask blank are mitigated. That is, the etching mask film is formed after film stresses have been mitigated in the etching stop film and light-shielding film which are to be left on the transparent substrate even after processing into a photomask, and the optional antireflective film. When the photomask blank is processed into a photomask, the etching mask film is not present on the photomask. Thus the method is successful in reducing film stresses in the films left on the substrate while excluding the influence of film stress in the etching mask film. Notably the time of heat treatment is typically up to 10 hours.

The photomask blank may be processed into a photomask having a mask pattern of etching stop film and light-shielding film on a transparent substrate. The photomask may be prepared from the photomask blank by the standard method. For example, the photomask may be prepared by the following procedure. First, a resist film for EB lithography is formed on the etching mask film, followed by patternwise EB writing and development to form a resist pattern. Using the resist pattern as an etching mask, oxygen-containing chlorine-base dry etching is performed to transfer the resist pattern to the etching mask film. Then using the etching mask film pattern as an etching mask, fluorine-base dry etching is performed to transfer the pattern to the light-shielding film. Then using the light-shielding film pattern as an etching mask, oxygen-containing chlorine-base dry etching is performed to transfer the pattern to the etching stop film and to remove the etching mask film, yielding a photomask. When it is desired to obtain a photomask in the form of a patterned transparent substrate, a resist pattern for protection is formed on the exposed film and a portion of the substrate not to be etched, fluorine-base dry etching is performed to form a pattern in the substrate, and the resist pattern is removed, yielding a photomask.

Referring to FIGS. 2 and 3, the process of manufacturing a photomask from the photomask blank is described in detail. FIG. 2 (FIGS. 2A to 2E) is a set of cross-sectional views showing one exemplary process of processing an inventive photomask blank into a binary photomask. The process starts with a photomask blank 100 having an etching stop film 2, a light-shielding film 3 and an etching mask film 4 deposited in order on a transparent substrate 1. First, a resist film 5 is formed on the etching mask film 4 of the photomask blank 100 (FIG. 2A). The resist film 5 is patterned to form a resist pattern 5a (FIG. 2B). With the resist pattern 5a made etching mask, oxygen-containing chlorine-base dry etching is performed to pattern the etching mask film 4 to form an etching mask film pattern 4a (FIG. 2C). It is noted the resist pattern 5a has been set to such a thickness that the resist pattern 5a may be consumed by this dry etching treatment. Next, with the etching mask film pattern 4a made etching mask, fluorine-base dry etching is performed to pattern the light-shielding film 3 to form a light-shielding film pattern 3a (FIG. 2D). Next, with the light-shielding film pattern 3a made etching mask, oxygen-containing chlorine-base dry etching is performed to pattern the etching stop film 2 consisting of first and second layers 21 and 22 to form an etching stop film pattern 2a and to remove the etching mask film pattern 4a (FIG. 2E). In this way, a binary photomask 100a is obtained.

FIG. 3 (FIGS. 3A to 3H) is a set of cross-sectional views showing one exemplary process of processing an inventive photomask blank into a Levenson phase shift photomask. The process starts with a photomask blank 100 of the same construction as above. First, a resist film 5 is formed on the etching mask film 4 of the photomask blank 100 (FIG. 3A). The resist film 5 is patterned to form a resist pattern 5a (FIG.

Figure 3A:
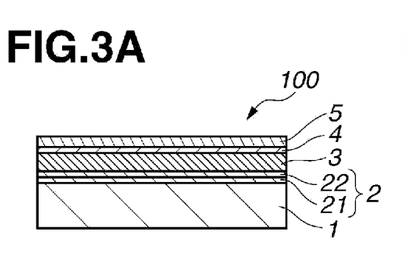
FIGS. 3A to 3H are set of cross-sectional views showing a series of steps for the manufacture of a photomask from an inventive photomask blank.
Figure 3B:
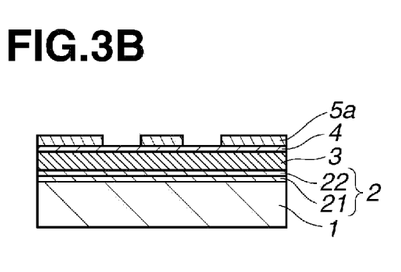
Figure 3C:
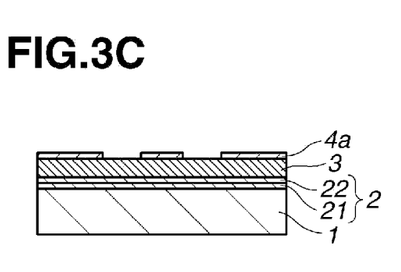
Figure 3D:
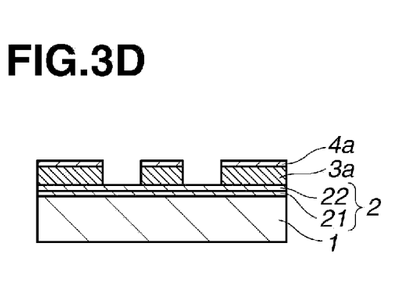
Figure 3E:
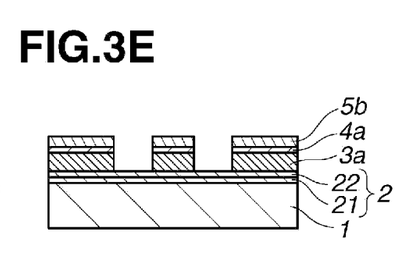
Figure 3F:
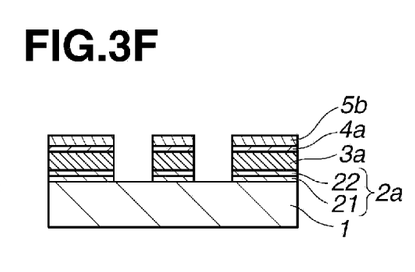
Figure 3G:
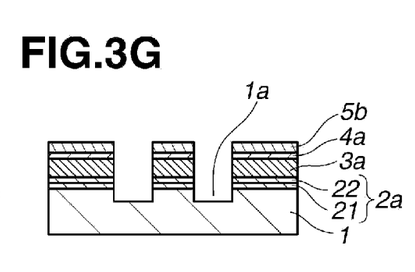
Figure 3H:
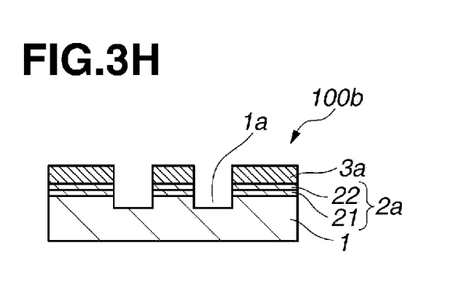

3B). With the resist pattern 5a made etching mask, oxygen-containing chlorine-base dry etching is performed to pattern the etching mask film 4 to form an etching mask film pattern 4a (FIG. 3C). It is noted the resist pattern 5a has been set to such a thickness that the resist pattern 5a may be consumed by this dry etching treatment. Next, with the etching mask film pattern 4a made etching mask, fluorine-base dry etching is performed to pattern the light-shielding film 3 to form a light-shielding film pattern 3a (FIG. 3D). Next, a resist pattern 5b is formed for protecting the etching mask film pattern 4a (FIG. 3E). With the light-shielding film pattern 3a made etching mask, oxygen-containing chlorine-base dry etching is performed to pattern the etching stop film 2 consisting of first and second layers 21 and 22 to form an etching stop film pattern 2a (FIG. 3F). Next, with the etching stop film pattern 2a made etching mask, fluorine-base dry etching is performed to pattern the transparent substrate 1 to engrave a recess 1a (FIG. 3G). The resist pattern 5b is removed by suitable means, and the etching mask film pattern 4a is removed by oxygen-containing chlorine-base dry etching (FIG. 3H). In this way, a Levenson phase shift photomask 100b is obtained.

EXAMPLE

Examples and Comparative Examples are given below by way of illustration and not by way of limitation.

Example 1

On a quartz substrate of 152 mm squares and 6.25 mm thick (6025 quartz substrate), an etching stop film consisting of a first layer of CrON (atomic ratio Cr:O:N=7:11:2) and 2 nm thick and a second layer of CrN (atomic ratio Cr:N=9:1) and 8 nm thick was deposited by sputtering. Next, a monolayer light-shielding film of MoSiN (atomic ratio Mo:Si:N=1:3:1) and 48 nm thick was deposited by sputtering.

The etching stop film and light-shielding film on the substrate was heat treated at 285° C. for 8 hours. Thereafter, a monolayer etching mask film of CrN (atomic ratio Cr:N=9:1) and 15 nm thick was deposited by sputtering, yielding a photomask blank. The photomask blank on the substrate side had a reflectance at exposure wavelength 193 nm, as reported in Table 1.

From the photomask blank, the etching mask film was removed by oxygen-containing chlorine-base dry etching, and the light-shielding film was removed by fluorine-base dry etching. The blank bearing the etching stop film was measured for bend by a flatness tester (Tropel UltraFlat, same hereinafter). Thereafter, the etching stop film was removed by oxygen-containing chlorine-base dry etching. The blank without the etching stop film was measured for bend again. A difference in bend before and after removal of the etching stop film is reported as warpage in Table 1.

Example 2

A photomask blank was prepared as in Example 1 except that the etching stop film consisted of a first layer of CrON (atomic ratio Cr:O:N=7:11:2) and 5 nm thick and a second layer of CrN (atomic ratio Cr:N=9:1) and 5 nm thick. The photomask blank on the substrate side had a reflectance at exposure wavelength 193 nm, as reported in Table 1. On the photomask blank, etching and bend measurement were carried out as in Example 1. A difference in bend before and after removal of the etching stop film is reported as warpage in Table 1.

Example 3

A photomask blank was prepared as in Example 1 except that the etching stop film consisted of a first layer of CrON (atomic ratio Cr:O:N=7:11:2) and 5 nm thick and a second layer of CrN (atomic ratio Cr:N=9:1) and 2 nm thick. The photomask blank on the substrate side had a reflectance at exposure wavelength 193 nm, as reported in Table 1. On the photomask blank, etching and bend measurement were carried out as in Example 1. A difference in bend before and after removal of the etching stop film is reported as warpage in Table 1.

Comparative Example 1

A photomask blank was prepared as in Example 1 except that the etching stop film was a monolayer of CrN (atomic ratio Cr:N=9:1) and 10 nm thick. The photomask blank on the substrate side had a reflectance at exposure wavelength 193 nm, as reported in Table 1. On the photomask blank, etching and bend measurement were carried out as in Example 1. A difference in bend before and after removal of the etching stop film is reported as warpage in Table 1.

TABLE 1

|  | Reflectance (%) | Warpage (nm) |
| --- | --- | --- |
| Example 1 | 31.9 | −3 |
| Example 2 | 24.1 | −35 |
| Example 3 | 22.6 | −37 |
| Comparative Example 1 | 40.0 | +19 |

It is noted that in Table 1, a positive (+) value of warpage indicates a warp by tensile stress and a negative (−) value of warpage indicates a warp by compressive stress. In Comparative Example 1, the warpage is 19 nm, whereas the reflectance on the substrate side is more than 35%, i.e., too high. In Examples 1 to 3, the reflectance on the substrate side is not more than 35% and the warpage is less than 50 nm.

Japanese Patent Application No. 2015-184560 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A photomask blank from which is produced a photomask comprising a transparent substrate and a mask pattern formed thereon including transparent regions and effectively opaque regions to exposure light, the photomask blank comprising
   an etching stop film disposed contiguous to the substrate and consisting of multiple layers formed of a material which is resistant to fluorine-base dry etching and removable by oxygen-containing chlorine-base dry etching,
   a light-shielding film which is disposed contiguous to the etching stop film and consists of a single layer of a silicon-containing material or multiple layers including at least one layer of a silicon-containing material, the silicon-containing material being resistant to oxygen-containing chlorine-base dry etching and removable by fluorine-base dry etching, and an etching mask film disposed on the light-shielding film and formed of a material which is resistant to fluorine-base dry etching and removable by oxygen-containing chlorine-base dry etching, wherein the photomask blank on the substrate side has a reflectance of up to 35% with respect to the exposure light, and the etching stop film includes a first layer which is disposed contiguous to the substrate and functions as an antireflective layer on the substrate side and a second layer functioning as a layer highly resistant to fluorine-base dry etching, one of the first and second layers is a layer having compressive stress induced therein and the other is a layer having tensile stress induced therein.

2. The photomask blank of claim 1 wherein the reflectance is up to 30%.

3. The photomask blank of claim 1 wherein each of the layers of the etching stop film is formed of chromium alone, a chromium compound containing chromium and at least one element selected from oxygen, nitrogen and carbon, tantalum alone, or a tantalum compound containing tantalum and being free of silicon.

4. The photomask blank of claim 1 wherein each of the layers of the etching stop film is formed of chromium alone or a chromium compound containing chromium and at least one element selected from oxygen, nitrogen and carbon, and at least one of the layers has a chromium content of less than 50 at %.

5. The photomask blank of claim 1 wherein the etching stop film has a thickness of 2 to 20 nm.

6. The photomask blank of claim 1 wherein the etching stop film is disposed on the substrate to cause a warpage of up to 50 nm.

7. The photomask blank of claim 6 wherein the warpage is up to 30 nm.

8. The photomask blank of claim 1 wherein the etching mask film is formed of chromium alone or a chromium compound containing chromium and at least one element selected from oxygen, nitrogen and carbon.

9. The photomask blank of claim 1 wherein the photomask is used to transfer a fine line pattern with a line width of up to 20 nm to an object to be transcribed.

10. The photomask blank of claim 1, further comprising an antireflective film of mono or multi-layer structure between the light-shielding film and the etching mask film, the antireflective film functioning as an antireflective layer on the side remote from the substrate.

11. The photomask blank of claim 10 wherein the antireflective film includes a layer of a transition metal/silicon compound containing a transition metal, silicon, and one or both of oxygen and nitrogen.

12. The photomask blank of claim 10 wherein the antireflective film includes a layer of chromium alone or a chromium compound containing chromium and one or both of oxygen and nitrogen.

13. A method for preparing the photomask blank of claim 1, comprising the steps of:

forming the etching stop film on the transparent substrate, forming the light-shielding film contiguous to the etching stop film, heat treating the etching stop film and the light-shielding film at 260 to 500° C. for at least 4 hours, and thereafter, forming the etching mask film on the light-shielding film.

14. A photomask comprising a transparent substrate and a mask pattern formed thereon including transparent regions and effectively opaque regions to exposure light, the mask pattern comprising an etching stop film of multiple layers formed of a material which is resistant to fluorine-base dry etching and removable by oxygen-containing chlorine-base dry etching, and a light-shielding film which is disposed contiguous to the etching stop film and consists of a single layer of a silicon-containing material or multiple layers including at least one layer of a silicon-containing material, the silicon-containing material being resistant to oxygen-containing chlorine-base dry etching and removable by fluorine-base dry etching, wherein the photomask on the substrate side has a reflectance of up to 35% with respect to the exposure light, and the etching stop film includes a first layer which is disposed contiguous to the substrate and functions as an antireflective layer on the substrate side and a second layer functioning as a layer highly resistant to fluorine-base dry etching, one of the first and second layers is a layer having compressive stress induced therein and the other is a layer having tensile stress induced therein.

* * * * *